(12) United States Patent
Radice et al.

(10) Patent No.: US 9,641,251 B1
(45) Date of Patent: May 2, 2017

(54) TRANSIMPEDANCE AMPLIFIER, AND RELATED INTEGRATED CIRCUIT AND OPTICAL RECEIVER

(71) Applicant: STMICROELECTRONICS S.R.L., Agrate Brianza (IT)

(72) Inventors: Francesco Radice, Capiago Intimiano (IT); Melchiorre Bruccoleri, Rho (IT); Maurizio Zuffada, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/140,868

(22) Filed: Apr. 28, 2016

(30) Foreign Application Priority Data

Oct. 12, 2015 (IT) ........................ 102015000060559

(51) Int. Cl.
| | |
|---|---|
| *H04B 10/00* | (2013.01) |
| *H04B 10/2507* | (2013.01) |
| *H03F 3/45* | (2006.01) |
| *H04B 10/61* | (2013.01) |
| *H04J 14/00* | (2006.01) |

(52) U.S. Cl.
CPC ..... *H04B 10/25073* (2013.01); *H03F 3/4508* (2013.01); *H03F 3/45179* (2013.01); *H04B 10/6162* (2013.01); *H03F 2203/45112* (2013.01); *H03F 2203/45142* (2013.01); *H03F 2203/45288* (2013.01)

(58) Field of Classification Search
CPC ........ H04B 10/60; H04B 10/66; H04B 10/69; H04B 10/693; H04B 10/6933
See application file for complete search history.

(56) References Cited

U.S. PATENT DOCUMENTS

| | | |
|---|---|---|
| 4,888,562 A | 12/1989 | Edler |
| 2002/0113645 A1 | 8/2002 | Lauffenburger et al. |
| 2006/0034622 A1* | 2/2006 | Day .................. H03F 1/26 398/208 |

(Continued)

OTHER PUBLICATIONS

Montgomery et al., "A 28 GHz Transimpedance Preamplifier with Inductive Bandwidth Enhancement," *Electron Devices Meeting, IEDM '92. Technical Digest, International*, pp. 423-426, 1992.

(Continued)

*Primary Examiner* — Daniel Dobson
(74) *Attorney, Agent, or Firm* — Seed IP Law Group LLP

(57) ABSTRACT

A transimpedance amplifier includes a first and a second power supply terminal for receiving a positive constant supply voltage, wherein the second power supply terminal represents a ground, and an input terminal adapted to be connected to a current source. The transimpedance amplifier further comprises a transistor comprising a control terminal and two further terminals, wherein the input terminal is connected to the control terminal of the first transistor. An inductor is connected between the first of the two further terminals of the transistor and the first power supply terminal, and a bias network is connected between the second of the two further terminals of the transistor and ground. Specifically, the transimpedance amplifier is configured such that the resistance between said first of said two further terminals of said first transistor and said first power supply terminal is small enough, such that said transimpedance amplifier operates as a differentiator.

21 Claims, 15 Drawing Sheets

(56) References Cited

U.S. PATENT DOCUMENTS

2006/0251428 A1* 11/2006 Gieseler .............. H03F 3/45085
398/189
2007/0018727 A1 1/2007 Lee et al.

OTHER PUBLICATIONS

Razavi, "Design of Integrated Circuits for Optical Communications," *McGraw-Hill Series in Electrical and Computer Engineering*, McGraw-Hill Science/Engineering/Math, $1^{st}$ ed., 2002, pp. 73-97. (25 pages).

* cited by examiner

TRANSIMPEDANCE AMPLIFIER, AND RELATED INTEGRATED CIRCUIT AND OPTICAL RECEIVER

BACKGROUND

Technical Field

Embodiments of the present disclosure relate to transimpedance amplifiers.

Description of the Related Art

Transimpedance amplifiers are well known in the art. Generally, a transimpedance amplifier (TIA) is a current-to-voltage converter, which usually also performs an amplification. For example, such TIAs are used, e.g., in optical receivers in order to convert the current provided by a photodiode into a corresponding voltage signal. Accordingly, a transimpedance amplifier should exhibit a low impedance to the photodiode and isolate it from the output voltage of the amplifier.

FIG. 1 shows in this respect a typical optical transmission system, which comprises an optical transmitter circuit 1 and an optical receiver circuit 3.

In the example considered, the transmitter circuit 1 comprises a signal generator 10 and optical transmitter 12 for generating an optical waveform, such as an LED (light emitting diode) or a laser diode. Substantially, the signal generator 10 receives a digital or analog data signal DI at input and generates a drive signal for the optical transmitter 12 as a function of the data signal DI, thereby transmitting the data signal DI via a modulation of the light emitted by the optical transmitter 12.

The optical receiver circuit 3 comprises a light sensor 30, such as a photodiode PD, a transimpedance amplifier 32 and a processing circuit 36.

In the example considered, the optical transmitter 12 may be coupled to the light sensor 30 by means of an optical fiber 2, and generally the light sensor 30 is configured to receive the light generated by the optical transmitter 12 (taking into account possible losses and noise generated by the fiber 2).

Specifically, in the example considered, the transimpedance amplifier 32 converts the current provided by the photodiode PD into a corresponding voltage signal $V_{out}$ indicative of the intensity of light received by the photodiode PD.

Accordingly, the processing circuit 36, which generally may be an analog and/or digital circuit, such as a microprocessor, e.g., a DSP (digital signal processor), may elaborate the voltage signal Vout in order to detect the data signal DI.

Generally, between the transimpedance amplifier 32 and the processing circuit 36 may be provided also further analog and/or digital signal processing stages 34, such as one or more amplifier stages and/or filters, such as bandpass filters.

FIG. 2 shows in this respect possible implementations of the optical frontend of the receiver circuit 3.

Specifically, in the example considered, the transimpedance amplifier 32 is based on a npn bipolar transistor Q1 having a given transconductance $g_m$.

Specifically, in the example considered, the base of the transistor Q1 is connected to the photodiode PD, the collector is connected to a constant positive supply voltage, such as VDD (e.g., a voltage between 1 and 5 VDC, with respect to ground GND), by means of a first resistor $R_C$, and the emitter is connect to ground GND by means of a second resistor $R_E$. In particular, in the example considered, the cathode of the photodiode PD is connected to the base of the transistor Q1.

In typical applications the photodiode PD is biased in some way. For example, in FIG. 2 the anode of the photodiode PD is connected (e.g., directly) to ground GND and the cathode of the photodiode PD is connected via a resistor or an active impedance $R_{bias}$ to a positive (preferably constant) bias voltage $V_{bias}$, which could also be the supply voltage VDD. Accordingly, the transistor Q1 is used basically in a common emitter configuration and the output voltage corresponds to the voltage at the collector of the transistor Q1.

In particular, as shown in FIG. 3, the photodiode PD may be modelled as an ideal photodiode 100, i.e., a current generator generating a current $I_S$, having connected in parallel a capacitor $C_{PD}$ and a resistor $R_{PD}$.

Accordingly, the current provided by the photodiode 100 will generate a variation at the base of the transistor Q, which will be amplified by the transistor Q1. Accordingly, in the examples considered, the voltage $V_{out}$ will reflect the variations of the current $I_S$ provided by the photodiode PD and thus will be indicative for the intensity of light received by the photodiode PD.

As shown in FIG. 4, a substantially similar schematic may be used also by replacing the bipolar transistor Q1 with a FET (field effect transistor), such as a MOSFET (metal-oxide-semiconductor field-effect transistor) Q2 by replacing the resistors $R_C$ and $R_E$ with corresponding resistors $R_D$ and $R_S$ at the drain and source of the transistor Q2 and connecting the photodiode PD to the gate of the transistor Q2.

In order to improve the bandwidth of the optical frontend, different techniques have been proposed.

For example, FIG. 5 shows the so called shunt inductive peaking.

Specifically, in this technique, an inductor $L_P$ is connected in series with the resistor $R_C$ in order to reduce the influence of the output capacitance $C_{out}$ of the optical front end, i.e., the capacitance between the output $V_{out}$ and ground GND.

Accordingly, this inductor $L_P$ will generate a resonance with the output capacitance $C_{out}$, thereby reducing the low pass filter effect of the capacitance $C_{out}$.

Conversely, FIG. 6 shows the so called series inductive peaking.

Specifically, in this technique, an inductor $L_S$ is connected between the cathode of the photodiode PD and the base of the transistor Q1. Accordingly, this inductor $L_S$ may be used to reduce the influence of the capacitance $C_{PD}$ (and possible other capacitors connected in parallel with the photodiode PD) at the input of the transimpedance amplifier 32.

Generally, the previous techniques, i.e., shunt inductive peaking and series inductive peaking, may also be combined.

The inventors have observed that the above techniques may not be sufficient.

Specifically, as shown in FIG. 7, indeed also the transimpedance amplifier 32 exhibits an input capacitance $C_{BE}$, which, e.g., corresponds to the base-emitter capacitance of the bipolar transistor Q1.

Accordingly, the capacitances $C_{PD}/C_{BE}$ and the inductor $L_S$ form indeed a CLC filter structure, which still limits the bandwidth of the optical front end.

BRIEF SUMMARY

According to one or more embodiments, one or more of the above problems are solved through a transimpedance amplifier having the features specifically set forth in the claims that follow. Embodiments moreover concern a related integrated circuit as well as a corresponding related optical receiver.

The claims are an integral part of the technical teaching of the disclosure provided herein.

As mentioned in the foregoing, the present disclosure relates to transimpedance amplifiers.

In various embodiments, the transimpedance amplifiers comprises a first and a second power supply terminal for receiving a positive constant supply voltage, wherein the second power supply terminal represents a ground.

The transimpedance amplifier comprises moreover an input terminal adapted to be connected to a current source. Specifically, in case of an optical frontend, the input terminal is connected to the cathode of a photodiode. In this case, the circuit may also comprise a bias circuit coupled to the input terminal.

In various embodiments, the input terminal is connected to the control terminal of a transistor, such as the base of a npn bipolar junction transistor or the gate of a field effect transistor. In various embodiments, an inductor is connected between a first terminal of the transistor, e.g., the collector of a npn bipolar junction transistor or the drain of said field effect transistor, and the power supply terminal. Instead, the second terminal of the transistor, e.g., the emitter of a npn bipolar junction transistor or the source of said field effect transistor, is connected via a bias network to ground.

However, contrary to the inductive shunt peaking technique, the transimpedance amplifier is configured such that the resistance between the first terminal of the transistor and the power supply terminal is kept low enough, such that the transimpedance amplifier operates as a differentiator thereby compensating the integrator behavior of the capacitances associated with the input terminal. Specifically, usually the related optical transmitter will drive the optical transmission means, e.g., a laser diode, with a signal having given spectrum. In this case, this resistance should be sufficiently small such that the transimpedance amplifier operates as a differentiator in the spectrum region where most of signal energy is located. For example, usually a resistance below 20 Ohm is appropriate. The inductance of the inductor may be selected based on the value of the capacitances associated with the input terminal, e.g., in the range between 500 pH (picohenry) and 5 nH (nanohenry), e.g., 1 to 2 nH.

For example, in various embodiments, the first terminal of the first transistor is connected to the power supply terminal directly via the inductor, and the resistance corresponds merely to line losses and the parasitic resistance of the inductor.

In various embodiments, the transimpedance amplifier may comprise a resistor connected in series with the inductor and at least one electronic switch. Specifically, this electronic switch may be used to selectively short circuit the resistor, thereby permitting an operation as a traditional transimpedance amplifier (with inductive shunt peaking) and a transimpedance amplifier operating as a differentiator.

In various embodiments, the solution may also be applied to a differential transimpedance amplifier. In this case, the transimpedance amplifier comprises a second transistor wherein the control terminal of the second transistor is connected to a reference signal.

BRIEF DESCRIPTION OF THE SEVERAL VIEWS OF THE DRAWINGS

Embodiments of the present disclosure will now be described with reference to the annexed drawings, which are provided purely by way of non-limiting example and in which.

DETAILED DESCRIPTION

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

In the following FIGS. 8 to 15 parts, elements or components which have already been described with reference to FIGS. 1 to 7 are denoted by the same references previously used in such Figures; the description of such previously described elements will not be repeated in the following in order not to overburden the present detailed description.

As mentioned in the foregoing, the present disclosure provides a novel transimpedance amplifier, which may be used to convert an input current into a output voltage, and which is suitable for high speed applications, such as above 25 GHz. Accordingly, the transimpedance amplifiers of the present disclosure may be used in high-speed optical receivers.

Figure 8:
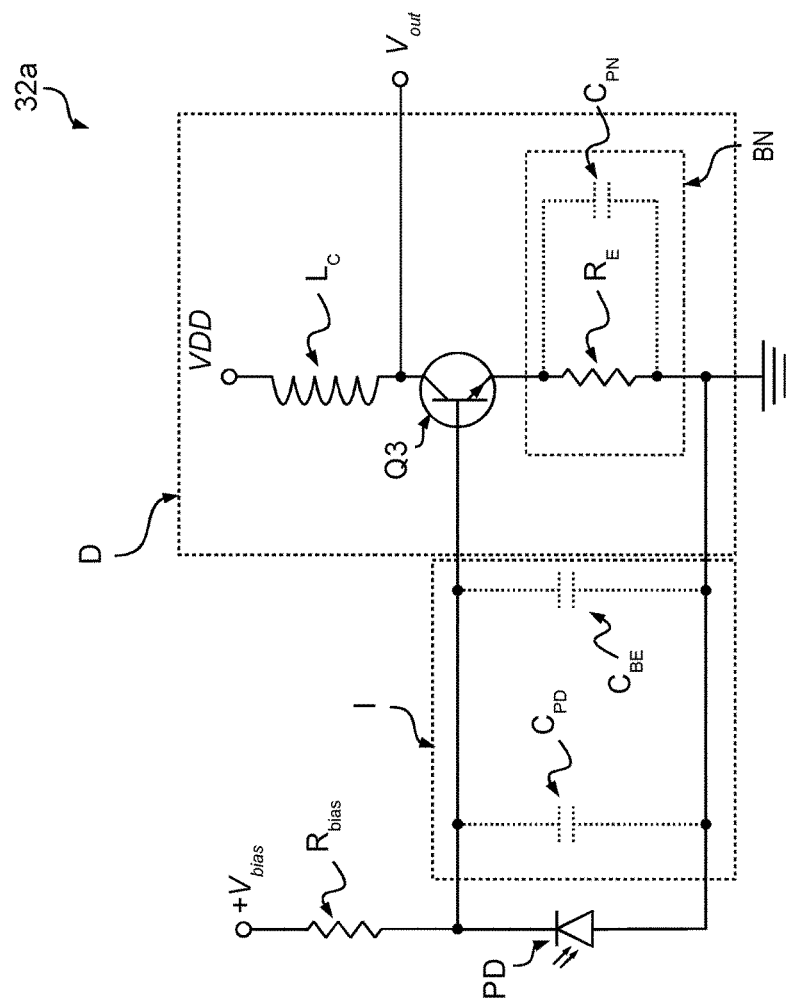
FIG. 8 shows a first embodiment of the frontend of an optical receiver in accordance with the present disclosure.

FIG. 8 shows in this respect the basic architecture of the front end of an optical receiver in accordance with one embodiment of the present disclosure.

Specifically, also in this case, a photodiode PD is connected to a transimpedance amplifier 32a.

Figure 1:
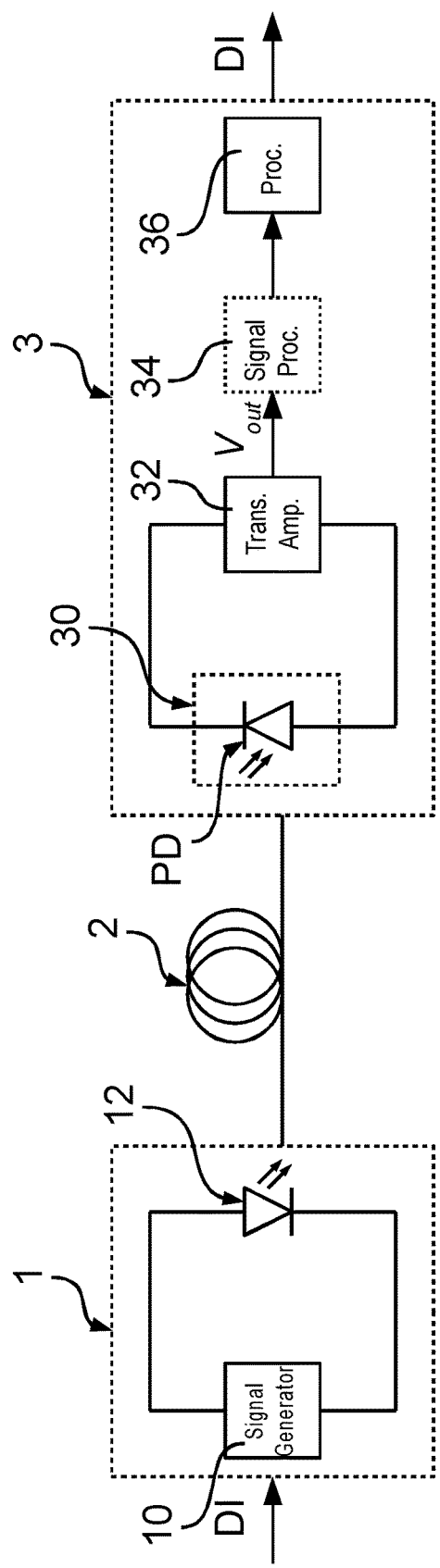
FIGS. 1 to 7 have already been described in the foregoing.
Figure 2:
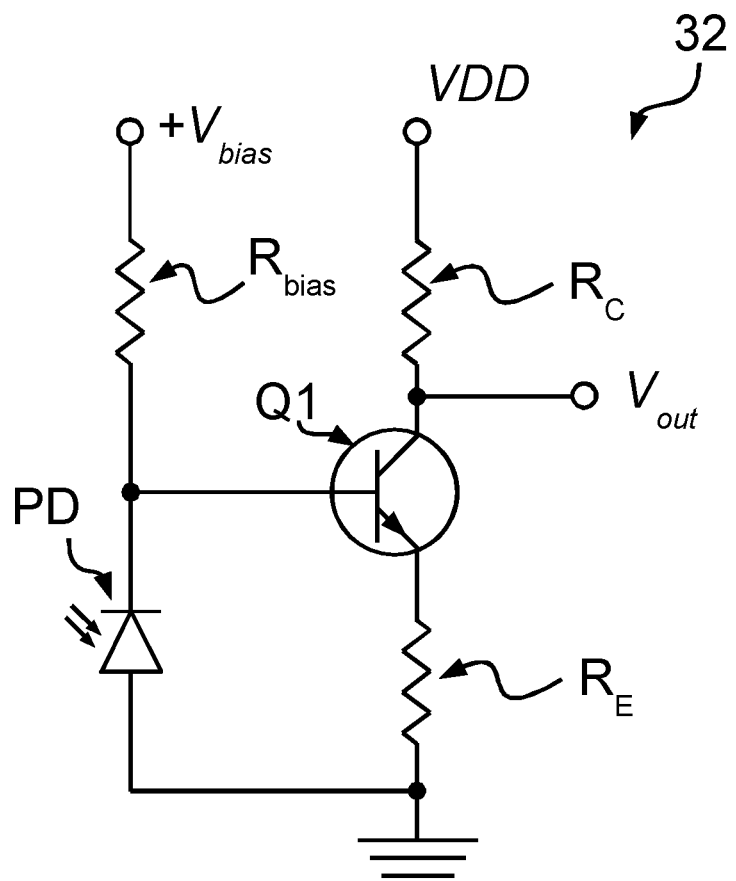
Figure 3:
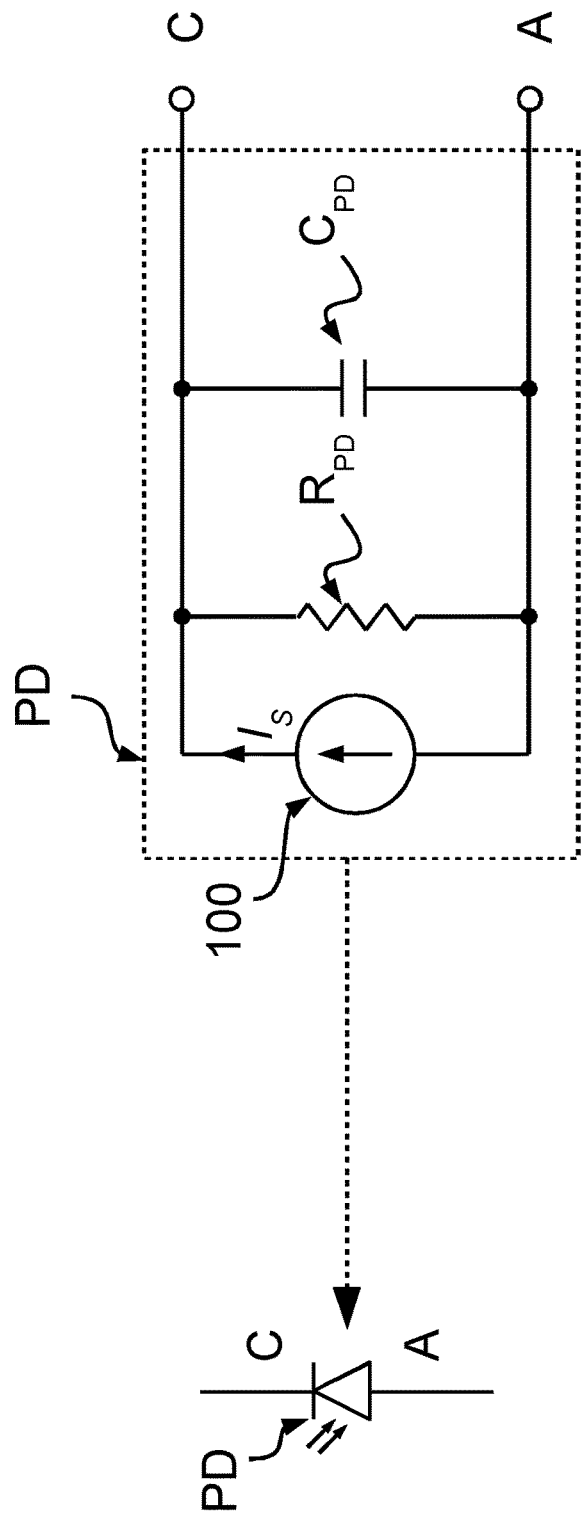

For example, in the embodiment considered, the photodiode PD is biased as in FIG. 2, i.e., by means of a resistor or active impedance $R_{bias}$ connected between the cathode of the photodiode PD and a positive constant bias voltage $+V_{bias}$. For example, a resistor $R_{bias}$ with a resistance between 1 and 20 kOhm, e.g., 3 to 5 kOhm, may be used for this purpose. However, also other circuits may be used to bias the photodiode PD.

Accordingly, also in the present optical front end, which is based on a transimpedance amplifier 32a, associated with the photodiode is a parasitic capacitance $C_{PD}$. Similarly, also the transimpedance amplifier 32a exhibits an input capacitance $C_{BE}$, which both influence negatively the bandwidth of the system.

In this respect, the inventors have observed that the capacitances $C_{PD}$ and $C_{BE}$ constitute a low pass filter, which represents an analog integrator I.

Figure 6:
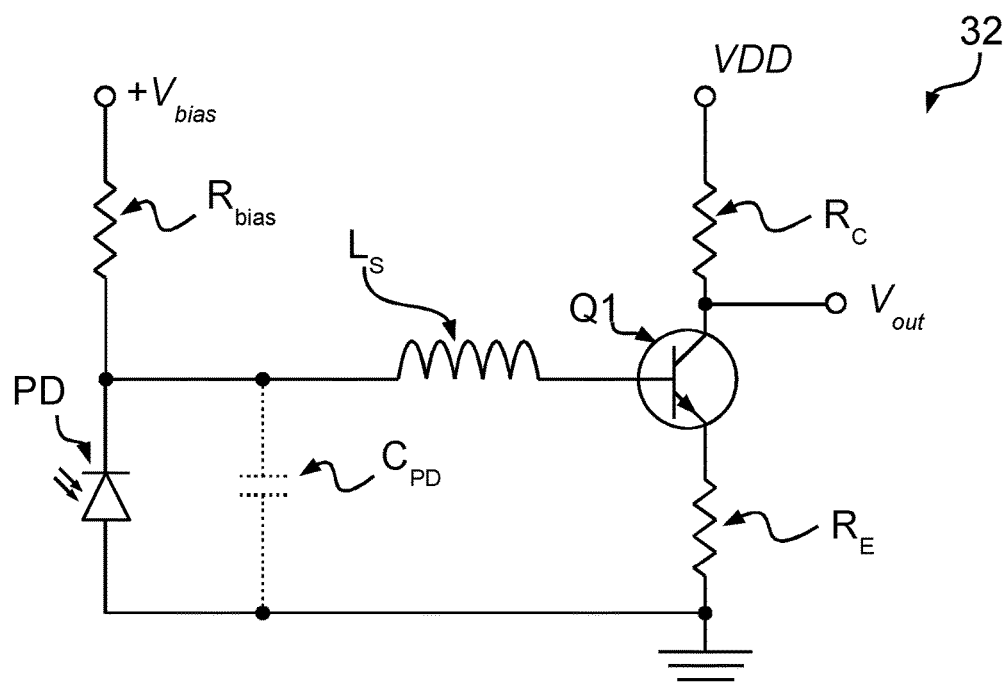
Figure 7:
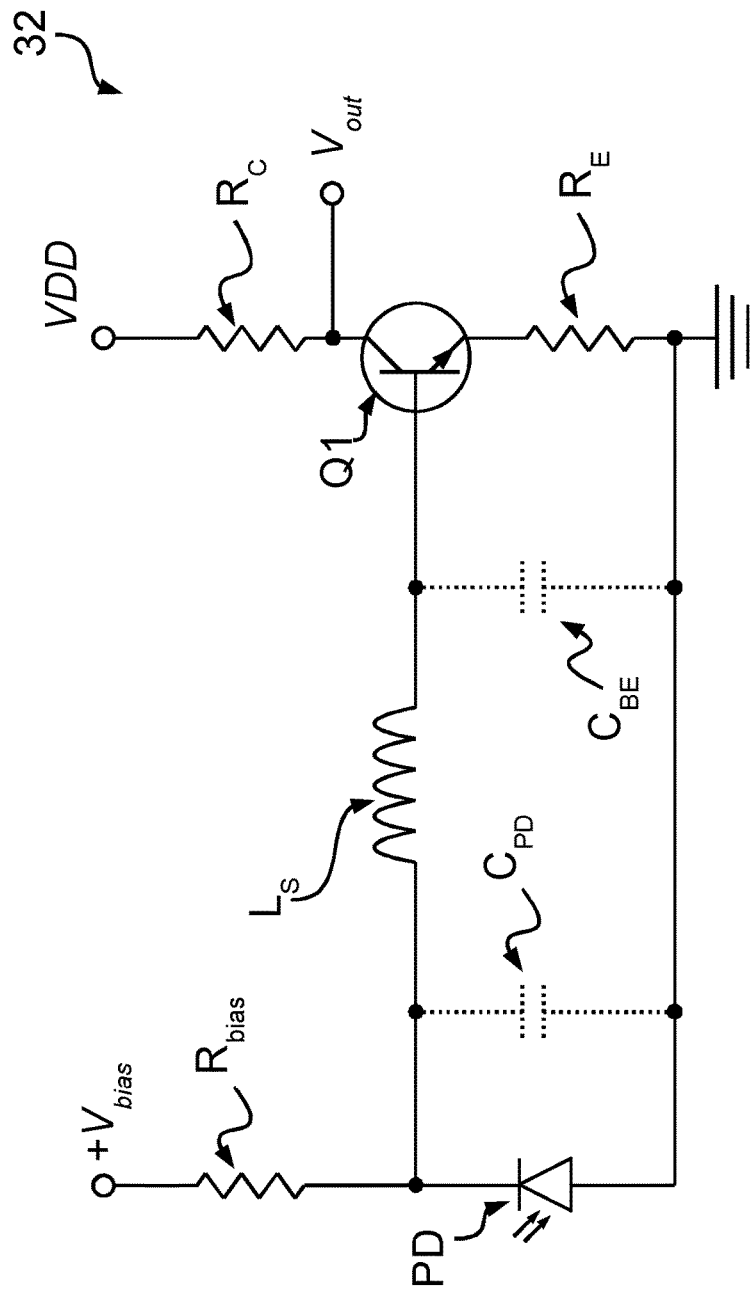

However, instead of trying to compensate the influence of this low-pass filter by a suitable filter structure at the input of the transimpedance amplifier 32a (e.g., series inductive peaking as shown in FIGS. 6 and 7), the present disclosure proposes the use of a transimpedance amplifier amplification stage, which operates as an analog differentiator D.

Specifically, in the embodiment shown in FIG. 8, the differentiator D is implemented with a npn bipolar transistor Q3 and a loading inductor $L_C$. In the embodiment considered, the base of the transistor Q3 is connected (e.g., directly) to the cathode of the photodiode PD, the collector is connected (e.g., directly) to a supply voltage VDD by means of an inductor $L_C$, and the emitter is connected (e.g., directly) to ground GND by means of a bias network BN.

For example, in the single ended configuration considered, the bias network BN may be implemented with a resistor $R_E$ and an optional capacitor $C_{PN}$ connected both in parallel between the emitter of the transistor Q3 and ground GND. For example, the capacitance of the capacitor $C_{PN}$ may be selected from the range of 5 to 50 pF (picofarad), e.g., 10 to 20 pF.

Accordingly, in the embodiment considered, only the inductor $L_C$ is connected between the supply voltage VDD and the collector C of the transistor Q3. Generally, the supply voltage VDD may be any constant positive voltage, such as a voltage selected between 1 and 5 VDC with respect to ground GND. For example, such a supply voltage VDD may be obtained through a voltage regulator, which should exhibit a rather low output impedance at high frequencies.

Thus, generally, also the embodiment shown in FIG. 8 comprises an inductor connected to the collector of a transistor. However, contrary to the inductive shunt peaking technique shown in FIG. 5, this inductor $L_C$ is not used to compensate the output capacitance $C_{out}$, but implements a differentiator D, which thus permits to compensate the integrator behavior of the capacitances at the input ($C_{PD}$ and $C_{BE}$).

Figure 9:
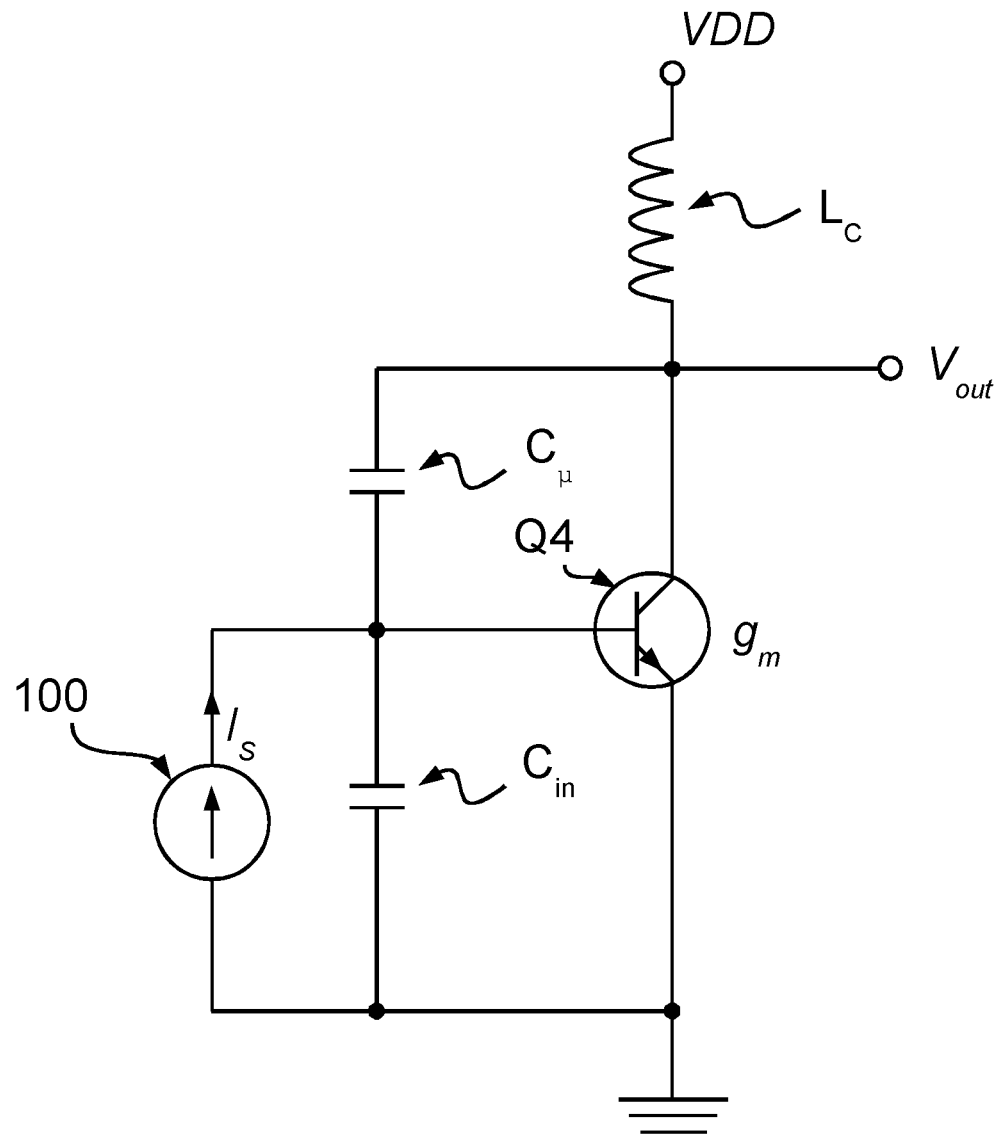
FIG. 9 shows a circuit schematic of a small signal model of the optical frontend of FIG. 8.

FIG. 9 shows in this respect a possible small signal model of the circuit shown in FIG. 8.

Specifically, as mentioned in the foregoing, the photodiode PD may be modelled with a current generator 100. For example, typical photodiodes provide a current variation in the range between 10 and 150 μA (microampere), e.g., 20-50 μA.

This current generator 100 is connected between the base of an (ideal) npn bipolar junction transistor Q4 having the gain $g_m$ of the transistor Q3.

Between the base of the transistor Q4 and ground GND is connected a capacitance $C_{in}$, which models the capacitance $C_{PD}$ of the photodiode PD and the capacitance $C_{BE}$ of the bipolar transistor Q3. For example, for typical photodiodes and BJT transistors, the value of $C_{in}$ may be in the range of 10 to 100 fF (femtofarad), e.g., 20 to 50 fF.

Similarly, a capacitance $C_\mu$ is connected between the base and the collector of the transistor Q4. This capacitance $C_\mu$ models the base-collector capacitance of the transistor Q3. Finally, the inductor $L_C$ is connected between the collector of the transistor Q4 and the supply voltage VDD.

Accordingly, by resolving the related circuit equations, the output voltage may be approximated as:

$$V_{out} = \left(\frac{g_m}{s(C_{in} + C_\mu)}\right) I_s(s) * \left(sL // g_m\left(\frac{C_{in}}{C_\mu}\right)\right)$$

where the operator "//" indicates that these components are connected in parallel (with A//B=(AB)/(A+B)). Accordingly, based on typical values of the above components, the term "$g_m(C_{in}/C_\mu)$" may be neglected.

From the above equation may thus be observed that the output impedance fully compensates the input impedance. In fact, merely the gain of the transimpedance amplifier 32a is decreases with increasing input capacitance values.

In the embodiment considered, the circuit operates without a feedback resistor, i.e., in an open loop configuration, which is significantly faster than the closed loop approach. Those of skill in the art will appreciate that the lack of feedback resistor also removes the associated noise. At high frequency, where the inductance is a high impedance, a further minor reducing effect may still be obtained by the feedback coupling of the parasitic capacitance $C_\mu$ between the base and the collector of the transistor Q3. Accordingly, the circuit in accordance with the present disclosure has significant advantages over the usual closed loop configuration with feedback-resistor, in particular with regards to the operation speed.

Figure 10:
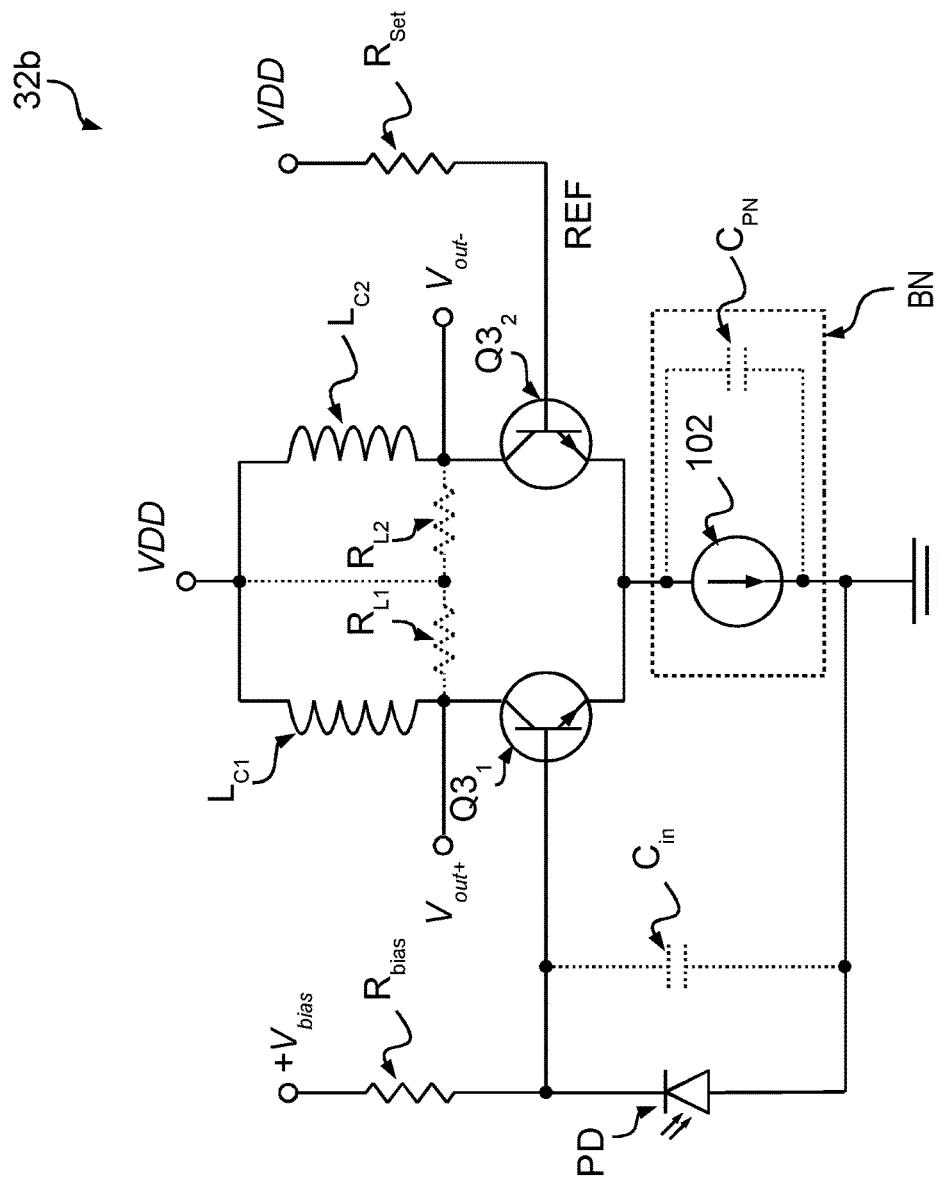
FIG. 10 shows a second embodiment of the frontend of an optical receiver in accordance with the present disclosure.

FIG. 10 shows an embodiment of a differential implementation of a transimpedance amplifier 32b in accordance with the present description.

In the embodiment considered, the transimpedance amplifier 32b is again coupled to a photodiode PD, which is in some way biased. For example, in the embodiment considered, the photodiode PD is biased via a resistor $R_{bias}$ connected between the cathode of the photodiode and a positive bias voltage $V_{bias}$.

Similarly, to the single-ended configuration shown in FIG. 8, the photodiode PD is connected (e.g., directly) to the base of a npn bipolar junction transistor $Q3_1$, which corresponds to the transistor in FIG. 8. Accordingly, also in this configuration, the collector of the transistor $Q3_1$ is connected (e.g., directly) via an inductor $L_{C1}$ to a constant positive supply voltage, e.g., VDD, and the emitter of the transistor $Q3_1$ is connected (e.g., directly) via a bias network BN to ground.

For example, in a differential configuration, the bias network BN may be implemented with a current generator 102 and an optional capacitor $C_{PN}$ connected in parallel. For example, in the embodiment considered, the current generator 102 may provide a current selected between 100 μA (microampere) and 10 mA (milliampere), e.g., between 400 μA and 4 mA.

The capacitance of the capacitor $C_{PN}$ may again be selected from the range of 5 to 50 pF (picofarad), e.g., 10 to 20 pF.

Accordingly, in the embodiment considered, the emitter of the transistor $Q3_1$ is connected via the current generator 102 to ground GND.

In order to implement a differential configuration, the transimpedance amplifier 32b comprises a complementary branch. Specifically, in the embodiment considered, the transimpedance amplifier 32b comprises a second npn bipolar junction transistor $Q3_2$, wherein the collector of the transistor $Q3_2$ is connected (e.g., directly) via a second inductor $L_{C2}$ to a constant positive supply voltage, e.g., VDD, and the emitter of the transistor $Q3_1$ is connected (e.g., directly) via the bias network BN to ground GND. The inductors $L_{C1}$ and $L_{C2}$ may have the same inductance and/or the inductance may be selected based on the value of the input capacitance $C_{in}$, e.g., in the range between 500 pH (picohenry) and 5 nH (nanohenry), e.g., 1 to 2 nH.

Different solutions may be used to obtain a reference signal REF at the base of the transistor $Q3_2$. For example, in the embodiment considered, the base of transistor Q3$_2$ is connected via a resistor R$_{Set}$ to a constant positive voltage, such as VDD.

However, also more complex solutions may be used, such as a second photodiode (with associated bias circuit). In this case, the second photodiode is not illuminated and merely provides the reference signal REF for the base of the transistor Q3$_2$.

In various embodiments, the transimpedance amplifiers 32a and 32b may comprise also a load resistor R$_L$ connected (e.g., directly) in parallel with the inductor L$_C$ or two load resistors R$_{L1}$ and R$_{L2}$ connected respectively in parallel with the inductors L$_{C1}$ and L$_{C2}$. These resistors may be suitable to damp the resonance peak given by the inductors and the load capacitance C$_{out}$.

For example, the resistance of these load resistors may be selected from the range between 50 Ohm and 500 Ohm, e.g., 100 to 300 Ohm.

Figure 4:
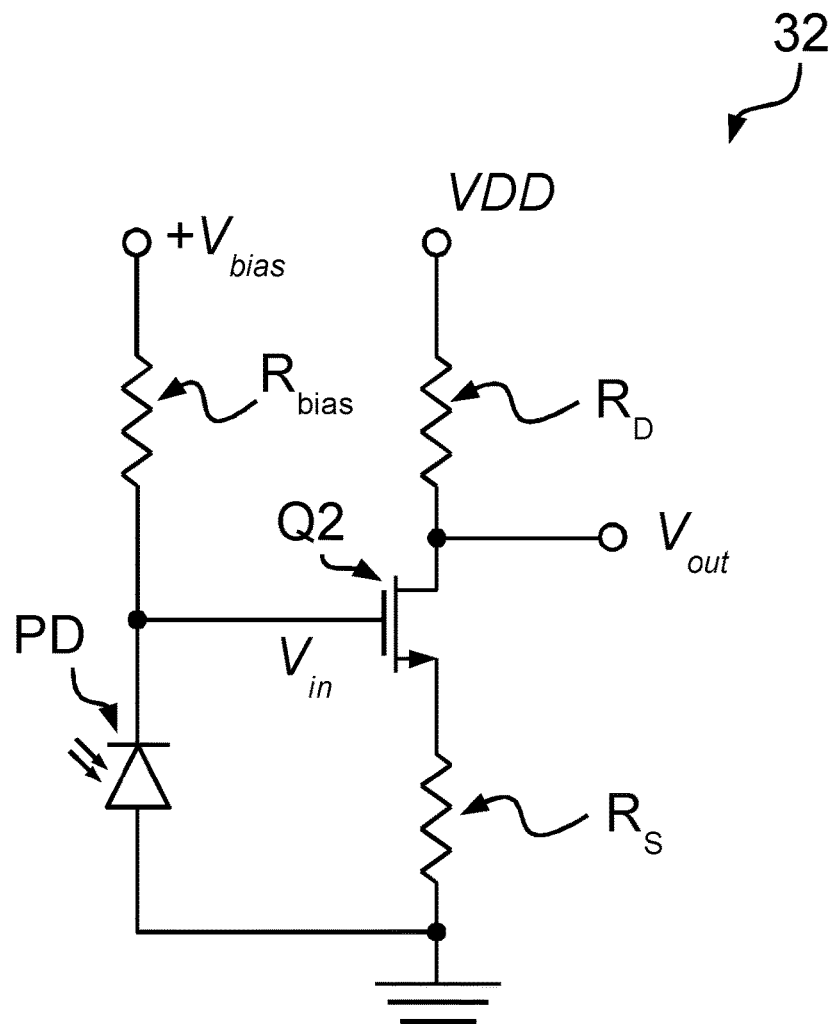

Generally, as already mentioned with respect to FIG. 4, the npn bipolar junction transistors Q3, Q3$_1$ and Q3$_2$ of a transimpedance amplifier 32a/32b may also be replaced with a FET (field effect transistor), such as an n-channel MOSFET (metal-oxide-semiconductor field-effect transistor).

Figure 11:
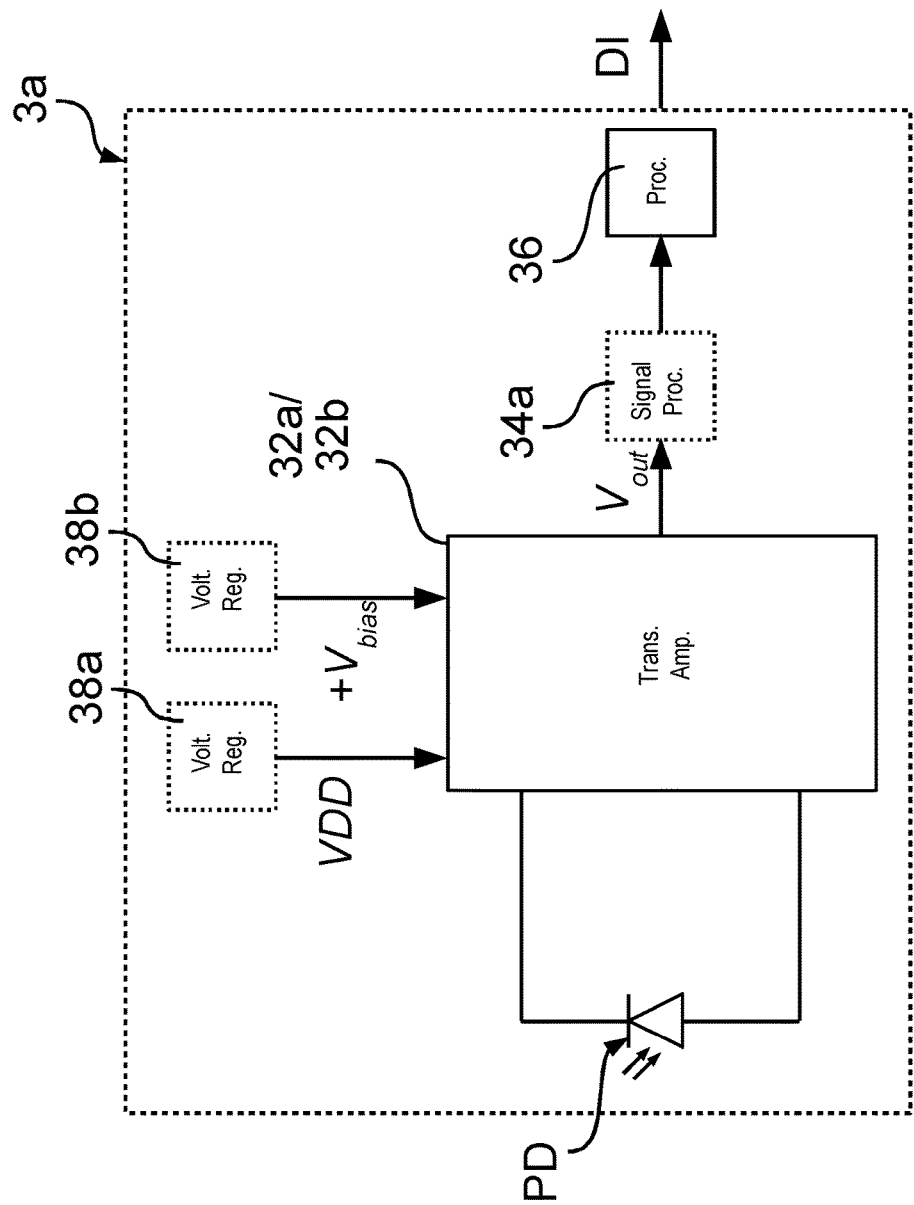
FIG. 11 shows an embodiment of an optical receiver in accordance with the present disclosure.

Accordingly, as shown in FIG. 11, an optical receiver circuit 3a in accordance with the present disclosure comprises a photodiode PD, a transimpedance amplifier 32a/32b and a processing circuit 36.

For example, the optical receiver circuit 3a may be integrated in an integrated circuit that is integrated in a semiconductor chip. Generally, the photodiode PD and/or the processing circuit 36 may be integrated with the transimpedance amplifier 32a or 32b or provided on a separate chip.

The optical receiver circuit 3a may also comprise one or more voltage regulator 38a and 38b configured to generate the voltages VDD and V$_{bias}$ for the transimpedance amplifier 32a or 32b. As mentioned in the foregoing, the voltage regulator 32a used to generate the voltage VDD should exhibit a rather low output impedance at high frequencies.

Finally, between the transimpedance amplifier 32a/32b and the processing circuit 36 may be provided also further analog and/or digital signal processing stages 34a, such as one or more amplifier stages and/or filters, such as bandpass filters.

Figure 12:
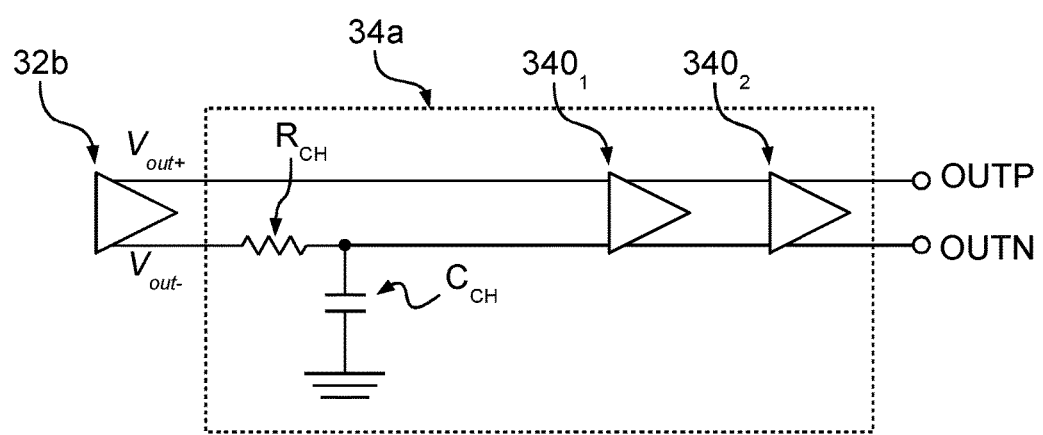
FIGS. 12 to 16 show further embodiments of optical receivers in accordance with the present disclosure.

For example, FIG. 12 shows an embodiment, in which the output of a differential transimpedance amplifier 32b is fed to one or more further amplifiers CH$_1$, CH2. For example, these amplifiers CH$_1$, CH2 may implement a Cherry-Hooper chain.

Between the various stages may also be provided filters, such as low pass RC filters comprising a resistor R$_{CH}$ and a capacitor C$_{CH}$.

Figure 14:
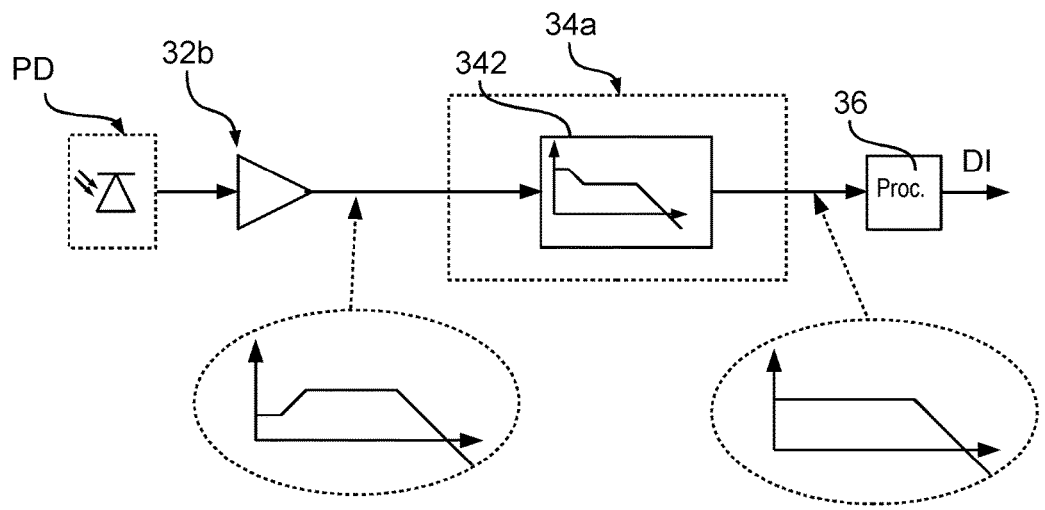

FIG. 14 shows an embodiment, in which the signal processing block 34a comprises at least one signal shaper circuit 342.

Figure 13:
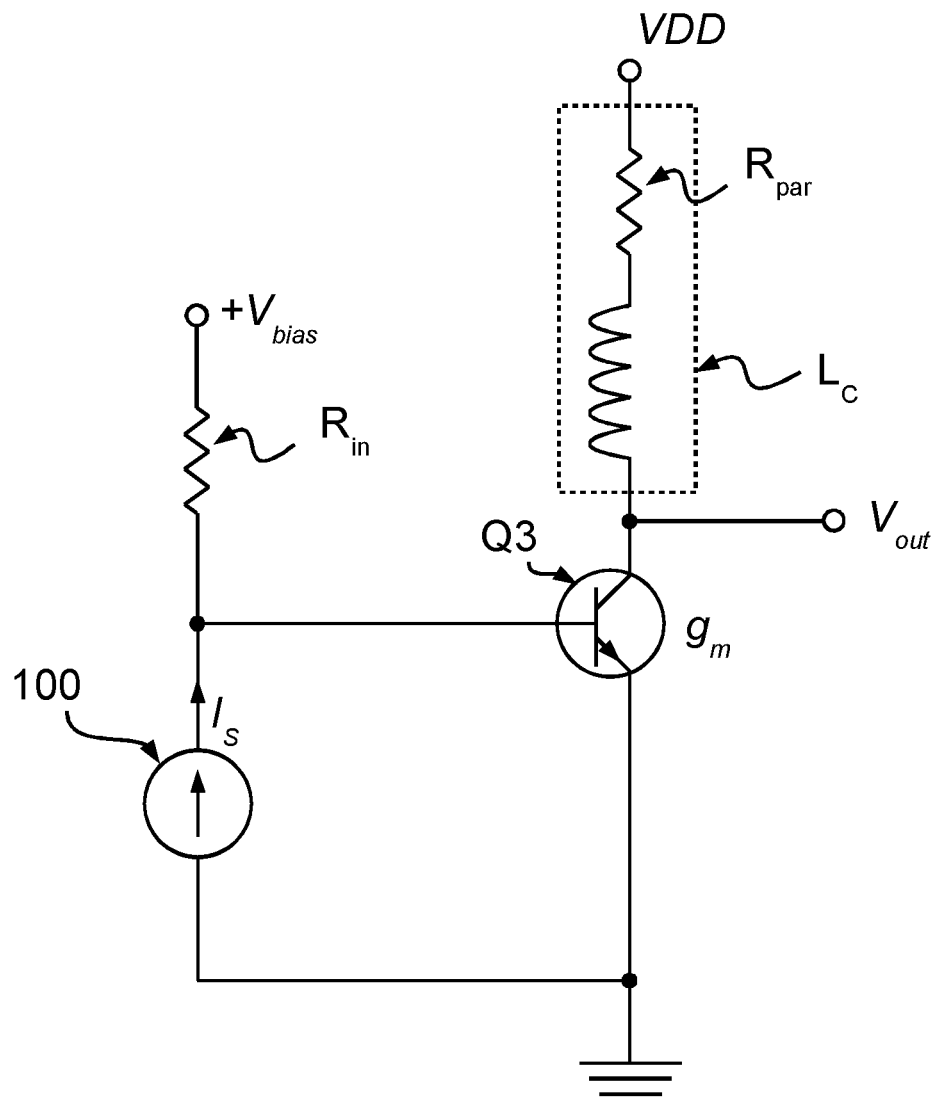

Specifically, as shown in FIG. 13, indeed also the inductor Lc will exhibit an equivalent series parasitic resistance R$_{par}$.

Figure 5:
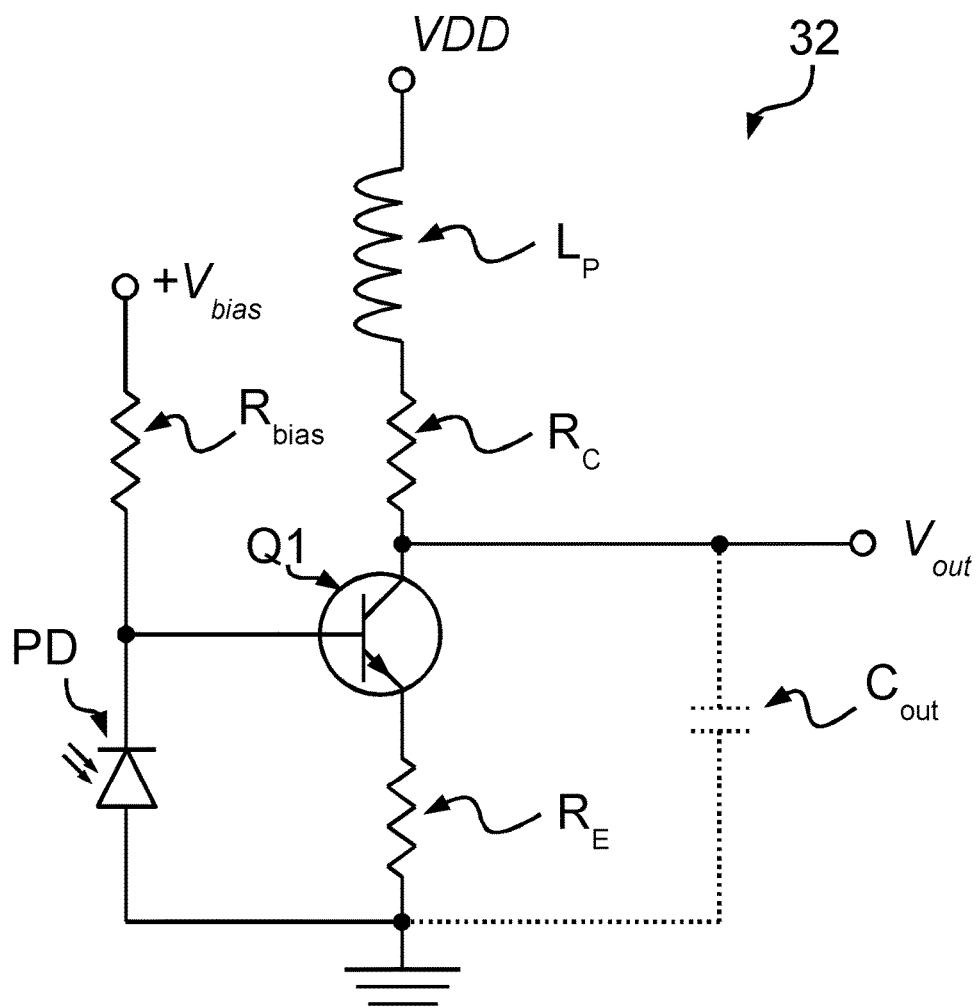

However, compared to a conventional resistor R$_C$ as shown, e.g., in FIG. 5, this resistance R$_{par}$ is usually smaller than 20 Ohm, e.g., smaller than 10 Ohm, and represents merely the parasitic resistance of the inductor L$_C$ and possible line losses.

However, at very low frequencies, the transimpedance gain of the amplifier will be affected by this parasitic resistance R$_{par}$. Specifically, at low frequencies, the gain Z$_{DC}$ of the transimpedance amplifier may be approximated by:

$$Z_{DC}=R_{in}g_mR_{par}$$

where R$_{in}$ represents the input resistance, which, e.g., corresponds to the bias resistance R$_{bias}$ and the photodiode resistance R$_{PD}$ in case of the photodiode PD is biased as shown in FIG. 2b.

Accordingly, as shown in FIG. 14, the low frequency gain of the amplifier 32a/32b is usually smaller than the high frequency gain (up to the cut off frequency of the amplifier). Accordingly, a shaper circuit 342, such as a zero pole equalizer, may be added in order to render the frequency gain again flat.

Finally, in order to handle different value ranges of optical power, i.e., different ranges of currents provided by the phododiode PD, the optical front end may comprise a plurality of transimpedance amplifiers, which may be enabled selectively.

Figure 15:
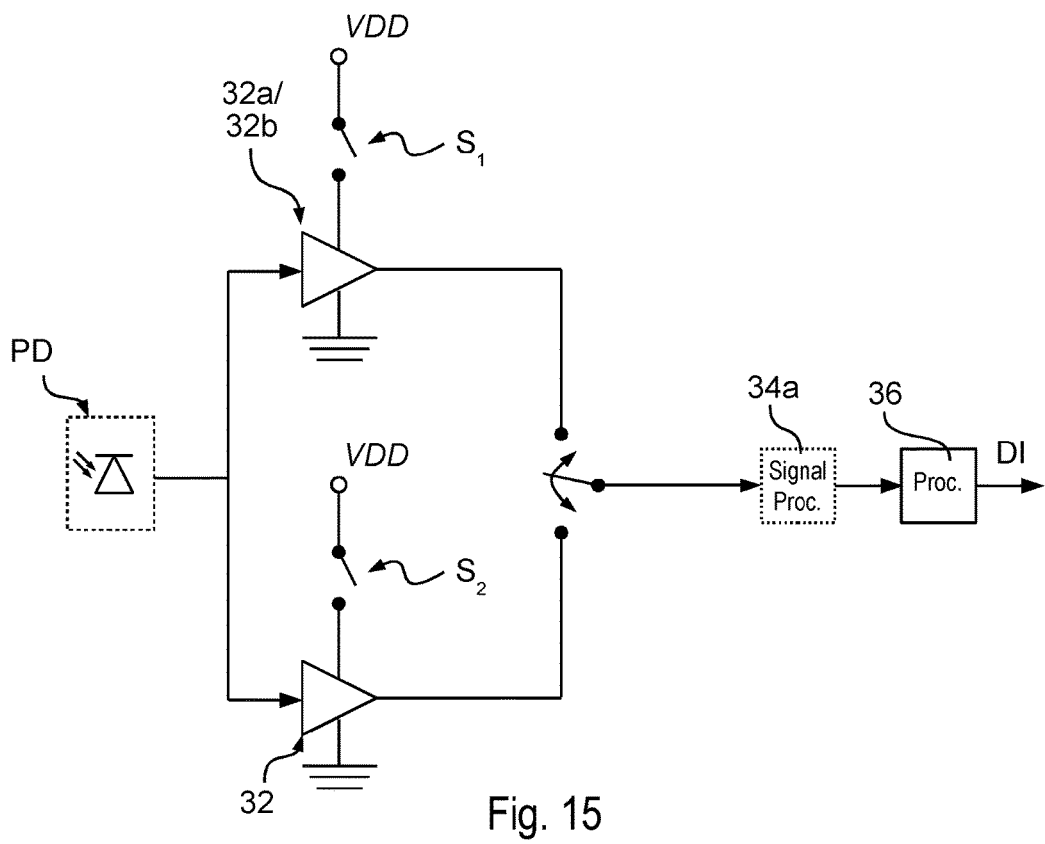

For example, FIG. 15 shows an embodiment, in which the optical receiver comprises in addition to a transimpedance amplifier 32a or 32b described in the foregoing a second transimpedance amplifier 32c. For example, the optical receiver 3a may be configured to enable (e.g., by means of an electronic switch S$_1$) the transimpedance amplifier 32a/32b for small currents I$_S$, e.g., below 50 μA, and enable (e.g., by means of an electronic switch S$_2$) the transimpedance amplifier 32c for higher currents I$_S$, e.g., above 50 μA. In this case, the transimpedance amplifier 32c may also be implemented with a conventional transimpedance amplifier, such as a closed loop TIA, because the signal to noise ratio is in this case sufficiently high.

In various embodiments, the gain of the transimpedance amplifier 32a or 32b may be variable.

Figure 16:
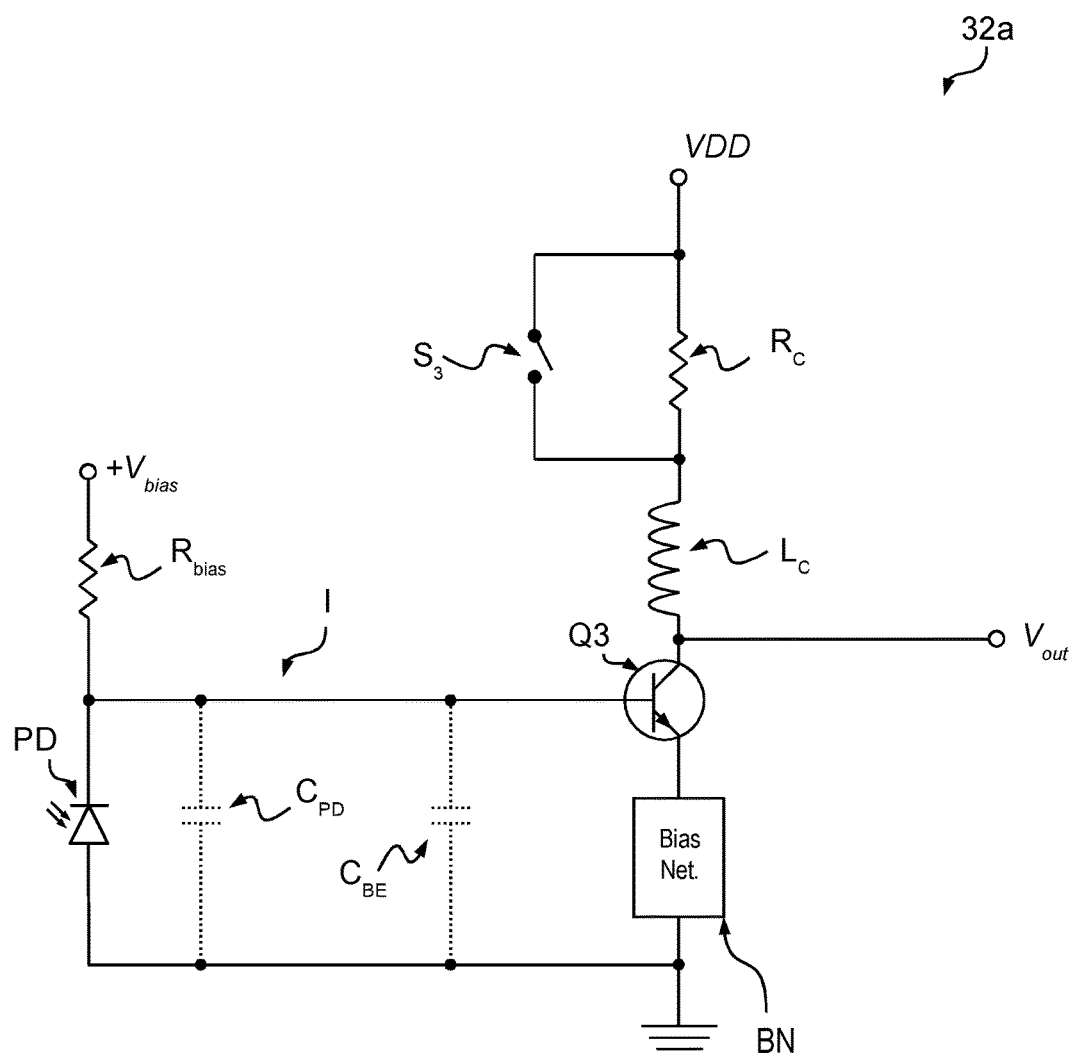

For example, as shown in FIG. 16, the amplifier 32a (and similarly also the amplifier 32b) may comprise a resistor R$_C$ and an electronic switch S$_3$. Specifically, the electronic switch S$_3$ may be used to short circuit the resistor R$_C$ or connect the resistor R$_C$ in series with the inductor L$_C$, thereby transforming the transimpedance amplifier 32a or 32b of the present disclosure in a conventions transimpedance amplifier with inductive shunt peaking as shown, e.g., in FIG. 5.

Specifically, when the switch S$_3$ is closed, the resistance between the collector of the transistor Q3 and the supply voltage VDD will again be so small that the transimpedance amplifier operates as a differentiator in the spectrum region where most of signal energy is located.

Of course, without prejudice to the principle of the disclosure, the details of construction and the embodiments may vary widely with respect to what has been described and illustrated herein purely by way of example, without thereby departing from the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transimpedance amplifier comprising:
  a first and a second power supply terminal for receiving a positive constant supply voltage, wherein said second power supply terminal represents a ground;

an input terminal configured to be electrically coupled to a current source, a first transistor including a control terminal and first and second conduction terminals, wherein said input terminal is electrically coupled to the control terminal of said first transistor;

a first inductor electrically coupled between the first conduction terminal of said first transistor and said first power supply terminal; and a bias network electrically coupled between the second conduction terminal of said first transistor and the second power supply terminal;

wherein said transimpedance amplifier has a resistance between said first conduction terminal of said first transistor and said first power supply terminal that is small enough to make said transimpedance amplifier operate as a differentiator.

2. The transimpedance amplifier according to claim 1, comprising a bias circuit coupled to the control terminal of said first transistor.

3. The transimpedance amplifier according to claim 1, wherein:

said first transistor is an npn bipolar junction transistor, wherein said control terminal of said first transistor is a base of said npn bipolar junction transistor, said first conduction terminal of said first transistor is a collector of said npn bipolar junction transistor and said second conduction terminal of said first transistor is an emitter of said npn bipolar junction transistor, or said first transistor is an n-channel field effect transistor, wherein said control terminal of said first transistor is a gate of said field effect transistor, said first conduction terminal of said first transistor is a drain of said field effect transistor and said second conduction terminal of said first transistor is a source of said field effect transistor.

4. The transimpedance amplifier according to claim 1, wherein said first conduction terminal of said first transistor is connected directly to said first power supply terminal via said first inductor.

5. The transimpedance amplifier according to claim 1, comprising a resistor and an electronic switch configured to selectively couple said resistor in series with said first inductor, such that the resistance between said first conduction terminal of said transistor and said first power supply terminal may be increased selectively.

6. The transimpedance amplifier according to claim 1, comprising:

a second inductor; and a second transistor having a control terminal and first and second conduction terminals, wherein said control terminal of said second transistor is configured to receive a reference signal, wherein the first conduction terminal of said second transistor is electrically coupled via the second inductor to said first power supply terminal, and wherein the second conduction terminal of said second transistor is electrically coupled via said polarization network to the second power supply terminal.

7. An integrated circuit comprising:

a semiconductor chip; and a transimpedance amplifier integrated in the semiconductor chip and including:

a first and a second power supply terminal for receiving a positive constant supply voltage, wherein said second power supply terminal represents a ground;

an input terminal configured to be electrically coupled to a current source, a first transistor including a control terminal and first and second conduction terminals, wherein said input terminal is electrically coupled to the control terminal of said first transistor;

a first inductor electrically coupled between the first conduction terminal of said first transistor and said first power supply terminal; and a bias network electrically coupled between the second conduction terminal of said first transistor and the second power supply terminal;

wherein said transimpedance amplifier has a resistance between said first conduction terminal of said first transistor and said first power supply terminal that is small enough to make said transimpedance amplifier operate as a differentiator.

8. The integrated circuit according to claim 7, wherein the current source is a photodiode having a cathode electrically coupled to said control terminal of said first transistor.

9. The integrated circuit according to claim 7, comprising:

a voltage regulator configured to generate said positive constant supply voltage for said transimpedance amplifier.

10. The integrated circuit according to claim 7, comprising:

one or more amplifiers electrically coupled in cascade with said transimpedance amplifier.

11. The integrated circuit according to claim 7, comprising:

a signal shaper circuit configured to compensate said resistance between said first of said first and second conduction terminals of said first transistor and said first power supply terminal in the frequency spectrum.

12. The integrated circuit according to claim 7, comprising:

a further transimpedance amplifier; and an electronic switch configured to selectively enable said transimpedance amplifier or said further transimpedance amplifier.

13. The integrated circuit according to claim 7, wherein the transimpedance amplifier includes a resistor and an electronic switch configured to selectively couple said resistor in series with said first inductor, such that the resistance between said first conduction terminal of said transistor and said first power supply terminal may be increased selectively.

14. The integrated circuit according to claim 7, wherein the transimpedance amplifier includes:

a second inductor; and a second transistor having a control terminal and first and second conduction terminals, wherein said control terminal of said second transistor is configured to receive a reference signal, wherein the first conduction terminal of said second transistor is electrically coupled via the second inductor to said first power supply terminal, and wherein the second conduction terminal of said second transistor is electrically coupled via said polarization network to the second power supply terminal.

15. An optical receiver comprising:

a photodiode; and a transimpedance amplifier including:

a first and a second power supply terminal for receiving a positive constant supply voltage, wherein said second power supply terminal represents a ground;

a first transistor including a control terminal and first and second conduction terminals, wherein said control terminal is electrically coupled a cathode of the photodiode;

a first inductor electrically coupled between the first conduction terminal of said first transistor and said first power supply terminal; and a bias network electrically coupled between the second conduction terminal of said first transistor and the second power supply terminal;

wherein said transimpedance amplifier has a resistance between said first conduction terminal of said first transistor and said first power supply terminal that is small enough to make said transimpedance amplifier operate as a differentiator.

16. The optical receiver according to claim 15, comprising:
a voltage regulator configured to generate said positive constant supply voltage for said transimpedance amplifier.

17. The optical receiver according to claim 15, comprising:
one or more amplifiers electrically coupled in cascade with said transimpedance amplifier.

18. The optical receiver according to claim 15, comprising:
a signal shaper circuit configured to compensate said resistance between said first of said first and second conduction terminals of said first transistor and said first power supply terminal in the frequency spectrum.

19. The optical receiver according to claim 15, comprising:
a further transimpedance amplifier; and
an electronic switch configured to selectively enable said transimpedance amplifier or said further transimpedance amplifier.

20. The optical receiver according to claim 15, wherein the transimpedance amplifier includes a resistor and an electronic switch configured to selectively couple said resistor in series with said first inductor, such that the resistance between said first conduction terminal of said transistor and said first power supply terminal may be increased selectively.

21. The optical receiver according to claim 15, wherein the transimpedance amplifier includes:
a second inductor; and
a second transistor having a control terminal and first and second conduction terminals, wherein said control terminal of said second transistor is configured to receive a reference signal, wherein the first conduction terminal of said second transistor is electrically coupled via the second inductor to said first power supply terminal, and wherein the second conduction terminal of said second transistor is electrically coupled via said polarization network to the second power supply terminal.

* * * * *